(12) United States Patent
Yamashita et al.

(10) Patent No.: US 10,385,447 B2
(45) Date of Patent: Aug. 20, 2019

(54) LAMINATED FILM AND FLEXIBLE ELECTRONIC DEVICE

(71) Applicant: SUMITOMO CHEMICAL COMPANY, LIMITED, Tokyo (JP)

(72) Inventors: Yasuhiro Yamashita, Tsukuba (JP); Hideaki Nakajima, Ichihara (JP); Yutaka Ito, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 77 days.

(21) Appl. No.: 15/509,082

(22) PCT Filed: Sep. 7, 2015

(86) PCT No.: PCT/JP2015/075288
§ 371 (c)(1),
(2) Date: Mar. 6, 2017

(87) PCT Pub. No.: WO2016/039280
PCT Pub. Date: Mar. 17, 2016

(65) Prior Publication Data
US 2017/0275752 A1 Sep. 28, 2017

(30) Foreign Application Priority Data

Sep. 8, 2014 (JP) ................................. 2014-182051

(51) Int. Cl.
*G01J 3/42* (2006.01)
*C23C 16/32* (2006.01)
(Continued)

(52) U.S. Cl.
CPC ................ *C23C 16/32* (2013.01); *B32B 9/00* (2013.01); *B32B 27/08* (2013.01); *C23C 16/401* (2013.01);
(Continued)

(58) Field of Classification Search
CPC ...... C23C 16/32; C23C 16/545; C23C 16/401; C23C 16/50; C23C 16/509; B32B 9/00;
(Continued)

(56) References Cited

U.S. PATENT DOCUMENTS

| 2011/0148050 A1 | 6/2011 | Vissing et al. |
| 2016/0312362 A1 | 10/2016 | Yamashita et al. |
| 2016/0312363 A1 | 10/2016 | Yamashita et al. |

FOREIGN PATENT DOCUMENTS

| JP | 2002-361774 A | 12/2002 |
| JP | 2006-233234 A | 9/2006 |

(Continued)

OTHER PUBLICATIONS

Machine english Translation of WO2014/092041 to Takahashi et al., 22 pages, internet retrieval date of Sep. 29, 2018. (Year: 2014).*

(Continued)

*Primary Examiner* — Jonathan C Langman
(74) *Attorney, Agent, or Firm* — Birch, Stewart, Kolasch & Birch, LLP (57) ABSTRACT

The invention provides a gas barrier laminated film having high impact resistance when a heterolayer is formed on a thin film layer. The laminated film includes a flexible substrate and a thin film layer formed on at least one surface of the substrate, wherein the thin film layer contains Si, O, and C, and the ratio of the number of carbon atoms to the number of silicon atoms which is calculated using peaks each corresponding to each binding energy of 2p of Si, 1s of O, 1s of N, and 1s of C obtained from wide scan spectrums is in the range defined by the following formula (1) when the surface of the thin film layer is subjected to X-ray photoelectron spectrometry, and a intensity ratio of a peak intensity ($I_2$) at 1240 to 1290 $cm^{-1}$ to a peak intensity ($I_1$) at 950 to 1050 $cm^{-1}$ is in the range defined by the following (Continued)

formula (2) when the surface of the thin film layer is measured by an ATR method in infrared spectrometry:

$$0.01 < C/Si \leq 0.02 \quad (1)$$

$$0.01 \leq I_2/I_1 < 0.05 \quad (2).$$

8 Claims, 1 Drawing Sheet

(51) Int. Cl.
  *G06F 1/16* (2006.01)
  *B32B 27/08* (2006.01)
  *H04M 1/02* (2006.01)
  *B32B 9/00* (2006.01)
  *C23C 16/509* (2006.01)
  *C23C 16/50* (2006.01)
  *C23C 16/40* (2006.01)
  *C23C 16/54* (2006.01)

(52) U.S. Cl.
  CPC ............ *C23C 16/50* (2013.01); *C23C 16/509* (2013.01); *C23C 16/545* (2013.01); *G01J 3/42* (2013.01); *G06F 1/1652* (2013.01); *H04M 1/0268* (2013.01); *B32B 2307/7242* (2013.01)

(58) Field of Classification Search
  CPC .... B32B 27/08; B32B 2307/7242; G01J 3/42; H04M 1/0268; G06F 1/1652
  See application file for complete search history.

(56) References Cited

FOREIGN PATENT DOCUMENTS

| | | |
|---|---|---|
| JP | 2008-49576 A | 3/2008 |
| JP | 2008-143097 A | 6/2008 |
| JP | 2010-158832 A | 7/2010 |
| JP | 2011-12285 A | 1/2011 |
| JP | 2012-81632 A | 4/2012 |
| JP | 2013-233716 A | 11/2013 |
| JP | 2006-96046 A | 4/2016 |
| WO | WO 2014/092041 A1 | 6/2014 |
| WO | WO 2015/098671 A1 | 7/2015 |
| WO | WO 2015/098672 A1 | 7/2015 |

OTHER PUBLICATIONS

International Search Report, issued in PCT/JP2015/075288 (PCT/ISA/210), dated Dec. 8, 2015.

Chinese Office Action and Search Report for Chinese Application No. 201580047436.9, dated Apr. 26, 2018, with English translations.

Chinese Office Action dated Dec. 29, 2018, for corresponding Chinese Application No. 201580047436.9, with an English translation.

* cited by examiner

LAMINATED FILM AND FLEXIBLE ELECTRONIC DEVICE

TECHNICAL FIELD

The present invention relates to a laminated film and a flexible electronic device.

BACKGROUND ART

Laminated films are known which are each provided with a thin film layer formed (laminated) on the surface of a substrate in order to impart functionality to a film-like substrate. For example, laminated films having gas barrier characteristics imparted by the formation of a thin film layer on a plastic film are suitable to the filling and packaging of products such as foods and drinks, cosmetics, and detergents. Laminated films have been recently proposed which have a structure in which a thin film of an inorganic oxide such as silicon oxide, silicon nitride, silicon oxynitride, or aluminum oxide is formed on one surface of a substrate film.

As a method for forming a thin film of an inorganic oxide on a surface of a plastic substrate in the above manner, film formation methods, for example, physical vapor deposition methods (PVD) such as a vacuum deposition method, sputtering method, ion plating method, and chemical vapor deposition methods (CVD) such as a low-pressure chemical vapor deposition method and plasma chemical vapor deposition method are known. Then, Patent Document 1 describes a gas barrier laminated film in which a thin film layer of silicon oxycarbide is formed by the above method.

PRIOR ART DOCUMENT

Patent Document

Patent Document 1: JP-2006-233234

SUMMARY OF THE INVENTION

Problems to be Solved by the Invention

However, when a layer (heterolayer) different from the laminated film was formed on the thin film layer of the gas barrier laminated film, the impact resistance of the obtained laminated film having the heterolayer is not necessarily sufficient.

In view of the above situation, the present invention has been made and it is an object of the present invention to provide a gas barrier laminated film having high impact resistance when a heterolayer is formed on a thin film layer.

Means for Solving the Problems

The present invention provides the following laminated film to solve the above problem.

Accordingly, the present invention provides a laminated film including a flexible substrate and a thin film layer formed on at least one surface of the substrate, wherein;

the thin film layer contains a silicon atom (Si), an oxygen atom (O), and a carbon atom (C), the ratio of the number of carbon atoms to the number of silicon atoms which is calculated using peaks each corresponding to each binding energy of 2p of Si, 1s of O, 1s of N, and 1s of C obtained from wide scan spectrums is in the range defined by the following formula (1) when the surface of the thin film layer is subjected to X-ray photoelectron spectrometry; and a intensity ratio of a peak intensity ($I_2$) at 1240 to 1290 $cm^{-1}$ to a peak intensity ($I_1$) at 950 to 1050 $cm^{-1}$ is in a range defined by the following formula (2) when the surface of the thin film layer is measured by an ATR method in infrared spectrometry:

$$0.01 < C/Si \leq 0.02 \tag{1}$$

$$0.01 \leq I_2/I_1 < 0.05 \tag{2}$$

In the laminated film of the present invention, the intensity ratio of a peak intensity ($I_3$) at 770 to 830 $cm^{-1}$ to a peak intensity ($I_1$) at 950 to 1050 $cm^{-1}$ is preferably in a range defined by the following formula (3) when the surface of the thin film layer is measured by an ATR method in infrared spectrometry:

$$0.25 \leq I_3/I_1 \leq 0.50 \tag{3}$$

In the laminated film of the present invention, the intensity ratio of a peak intensity ($I_4$) at 870 to 910 $cm^{-1}$ to a peak intensity ($I_3$) at 770 to 830 $cm^{-1}$ is preferably in a range defined by the following formula (4) when the surface of the thin film layer is measured by an ATR method in infrared spectrometry:

$$0.70 \leq I_4/I_3 < 1.00 \tag{4}$$

In the laminated film of the present invention, the laminated film preferably satisfies all of the following requirements (i) to (iii) in a silicon distribution curve, oxygen distribution curve, and carbon distribution curve indicating the relationship between the distance from the surface of the thin film layer in the direction of the film thickness of the thin film layer and the atomic number ratio of silicon, the atomic number ratio of oxygen, and the atomic number ratio of carbon to the total number of silicon atoms, oxygen atoms, and carbon atoms contained in the thin film layer;

(i) the atomic number ratio of silicon, the atomic number ratio of oxygen, and the atomic number ratio of carbon satisfy a requirement represented by the following formula (5) in 90% or more of an area of the thin film layer in the film thickness direction of the thin film layer:

$$\text{Atomic number ratio of oxygen} > \text{Atomic number ratio of silicon} > \text{Atomic number ratio of carbon} \tag{5}$$

(ii) the carbon distribution curve has at least one extreme value; and (iii) an absolute value of a difference between a maximum value and a minimum value of the atomic number ratio of carbon in the carbon distribution curve is 0.05 or more.

In the laminated film of the present invention, the absolute value of a difference between the maximum value and the minimum value of the atomic number ratio of silicon in the silicon distribution curve is preferably less than 5 at %.

In the laminated film of the present invention, the thin film layer is preferably formed by a plasma CVD process.

In the laminated film of the present invention, the thin film layer is preferably formed by using a glow discharge plasma.

The present invention also provides a flexible electron device including, as a substrate, the above laminated film as a substrate.

Effect of the Invention

According to the present invention, a gas barrier laminated film can be provided which has high impact resistance when a heterolayer is formed on the thin film layer. The laminated film of the present invention tends to be superior in optical characteristics, gas barrier characteristics, and adhesive force, so that it can be used as a substrate of a flexible electronic device and is therefore industrially useful.

MODES FOR CARRYING OUT THE INVENTION

[Laminated Film]

A laminated film according to the present invention includes a flexible substrate and a thin film layer formed on at least one surface of the substrate and the thin film layer contains a silicon atom (Si), oxygen atom (O), and carbon atom (C).

The laminated film explained hereinbelow is one provided with one thin film layer on one of two surfaces of the flexible substrate. In this case, the aforementioned laminated film may be one provided with a thin film layer not only on one surface of the flexible substrate but also on the other surface. Here, the layer means one manufactured by a single production method.

The flexible substrate has a film-like or sheet-like form and examples of the material of the flexible substrate include resins and composite materials containing resins.

Examples of the resin include polyethylene terephthalate (PET), polybutylene terephthalate (PBT), polyethylene naphthalate (PEN), acrylate, methacrylate, polycarbonate (PC), polyarylate, polyethylene (PE), polypropylene (PP), cyclic polyolefin (COP, COC), polyamide, aromatic polyamide, polystyrene, polyvinyl alcohol, a saponified product of an ethylene-vinyl acetate copolymer, polyacrylonitrile, polyacetal, polyimide, polyether imide, polyamideimide, polyether sulfide (PES), and polyether ether ketone.

Examples of the composite material containing resin include substrates of a silicone resin such as polydimethylsiloxane, substrates of an organic/inorganic hybrid resin such as polysilsesquioxane, glass composite substrates, and glass epoxy substrates.

The material of the flexible substrate may be only one type or combinations of two or more types.

Among these, PET, PBT, PEN, cyclic polyolefin, polyimide, aromatic polyamide, glass composite substrates, or glass epoxy substrates are preferable as the material of the flexible substrate from the viewpoint of high transparency and heat resistance and low coefficient of linear thermal expansion.

The flexible substrate is preferably colorless and transparent from the viewpoint of the possibilities of transmitting or absorbing light. More specifically, the total light transmittance of the flexible substrate is preferably 80% or more and more preferably 85% or more. Also, the haze value (haze) of the flexible substrate is preferably 5% or less, more preferably 3% or less, and even more preferably 1% or less.

The flexible substrate preferably has insulation properties and an electric resistance of $10^6$ Ωcm or more from the viewpoint of the possibility of using the flexible substrate as substrates for electronic devices and energy devices.

The thickness of the flexible substrate may be properly set in consideration of stable production of a laminated film. For example, the thickness of the flexible substrate is preferably 5 to 500 μm, more preferably 10 to 200 μm, and even more preferably 50 to 100 μm from the viewpoint of the possibility of conveying a film even under vacuum.

The flexible substrate may be provided with at least one selected from the group consisting of a primer coat layer and undercoat layer. When such a layer exists on the flexible substrate, a substrate including this layer is regarded as the flexible substrate in the present invention. The primer coat layer and/or undercoat layer is used to improve adhesion between the flexible substrate and the thin film layer and/or flatness of the both. The primer coat layer and/or undercoat layer can be formed by properly using known primer coat agents, undercoat agents, and the like.

The flexible substrate may be subjected to liquid washing treatment for cleaning the surface of the organic layer on the side on which the thin film layer is to be formed, because the adhesion of the organic layer to the thin film layer is improved. Examples of the liquid washing treatment include pure water washing treatment, ultra-pure water washing treatment, ultrasonic water washing treatment, scrub washing treatment, rinse-washing treatment, and two-fluid rinsing treatment.

The flexible substrate is preferably subjected to surface activation treatment for cleaning the surface of the organic layer on the side on which the thin film layer is to be formed, because the adhesion of the organic layer to the thin film layer is improved. Examples of the surface activation treatment include corona treatment, vacuum plasma treatment, atmospheric plasma treatment, UV ozone treatment, vacuum ultraviolet excimer lamp treatment, and flame treatment.

The above thin film layer contains a silicon atom, oxygen atom, and carbon atom from the viewpoint of high denseness and a reduction of defects such as small gaps and cracks. In this case, the major component of the thin film layer is preferably a compound represented by the general formula $SiO_\alpha C_\beta$. Here, "major component" means that the content of the component is 50% by mass or more, preferably 70% by mass or more, and more preferably 90% by mass or more based on the mass of all components of the material. In this general formula, α is selected from positive numbers less than 2 and β is selected from positive numbers less than 2. One or more of α and β in the above general formula may be either constant or variable in the thickness direction of the thin film layer.

Furthermore, the thin film layer may contain elements other than a silicon atom, oxygen atom, and carbon atom, for example, one or more atoms of a hydrogen atom, nitrogen atom, boron atom, aluminum atom, phosphorus atom, sulfur atom, fluorine atom, and chlorine atom.

When the thin film layer contains a hydrogen atom besides a silicon atom, oxygen atom, and carbon atom, a compound represented by the general formula $SiO_\alpha C_\beta H_\gamma$ is preferably a major component of the thin film layer. Here, "major component" means that the content of the component is 50% by mass or more, preferably 70% by mass or more, and more preferably 90% by mass or more based on the mass of all components of the material. In this general formula, α is selected from positive numbers less than 2, β is selected from positive numbers less than 2, and γ is selected from positive numbers less than 6. One or more of α, β, and γ in the above general formula may be either constant or variable in the thickness direction of the thin film layer.

When the average atomic number ratio of a carbon atom (C) to a silicon atom (Si) in the thin film layer is represented by C/Si, the ratio is preferably in the range of 0.10<C/Si<0.50, more preferably in the range of 0.15<C/Si<0.45, even more preferably in the range of 0.20<C/Si<0.40, and particularly preferably in the range of 0.25<C/Si<0.35 from the viewpoint of high denseness and a reduction of defects such as small gaps and cracks.

When the average atomic number ratio of an oxygen atom (0) to a silicon atom (Si) in the thin film layer is represented by O/Si, the ratio is preferably in the following of 1.50<O/Si<1.90, more preferably in the range of 1.55<O/Si<1.85, even more preferably in the range of 1.60<O/Si<1.80, and particularly preferably in the range of 1.65<O/Si<1.75 from the viewpoint of high denseness and a reduction of defects such as small gaps and cracks.

In this case, the above average atomic number ratios C/Si and O/Si can be calculated after depth profile measurement is made in the following condition by X-ray photoelectron spectrometry (XPS) and the average atom concentration of each atom in the direction of the thickness is found from each distribution curve of a silicon atom, nitrogen atom, oxygen atom, and carbon atom.

<XPS Depth Profile Measurement>

Etching ion species: Argon ($Ar^+$)

Etching rate (conversion value in terms of $SiO_2$ thermal oxide film): 0.05 nm/sec Etching interval (conversion value in terms of $SiO_2$): 10 nm X-ray photoelectron spectroscopic apparatus: (Model name: "VG Theta Probe", manufactured by Thermo Fisher Scientific Inc.)

X-rays to be irradiated: single crystal spectrum $AlK\alpha$

X-ray, spot and size: 800×400 μm elliptic shape

With regard to the thin film layer, the atomic number ratio of carbon/silicon which is calculated from wide scan spectrums is in the range defined by the following formula (1) when the surface of the thin film layer is subjected to X-ray photoelectron spectrometry.

$$0.01<C/Si \leq 0.20 \quad (1)$$

The atomic number ratio of carbon/silicon which is calculated from wide scan spectrums is considered to represent an atomic number ratio on the outermost surface of the thin film layer. The laminated film which satisfies the above formula (1) is reduced in the amounts of impurities contained in a raw material to be formed on the outermost surface of the thin film layer, impurities generated during the course of film formation, and impurities adsorbed to the film after the film formation and tends to be also superior in impact resistance when a separate layer is formed on the thin film layer. The atomic number ratio of carbon/silicon is preferably in the range of $C/Si \leq 0.20$ from the viewpoint of reducing impurities on the outermost surface of the thin film layer. Also, when C/Si=0.00, the thin film layer is easily adversely affected by impurities from an external environment and it is therefore difficult to control the wettability of the outermost surface of the thin film layer. Therefore, the atomic number ratio of carbon/silicon is preferably in the range of C/Si>0.01 and more preferably in the range of $C/Si \geq 0.02$.

Here, the surface of the thin film layer indicates surface of the laminated film when the thin film layer exists on the outermost surface of the thin film layer and indicates a surface to be the surface of the laminated film when all layers existing on the thin film layer are removed from the laminated film in the case where further layers exist on the thin film layer (on a plane far apart from the substrate in the thin film layer). When other layers are formed on the thin film layer, it is preferable to measure wide scan spectrums before other layers are formed, whereas when other layers have been already formed, all layers existing on the thin film layer may be removed from the laminated film to measure wide scan spectrums.

The wide scan spectrums can be subjected to X-ray photoelectron spectrometry and can be measured by a commercially available instrument (for example, "QuanteraSXM", which is a product from ULVAC PHI, Inc.). As to the condition of measurement, an example is given in which $AlK\alpha$ rays (1486.6 eV, X-ray spot: 100 μm) are used as the X-ray source and a neutralization electron gun (1 eV) or slow Ar ion gun (10V) is used for electrification correction in the measurement. In the analysis after measurement, the obtained spectrums may be analyzed using a commercially available peak analysis software (for example, MultiPak V6.1A, manufactured by ULVAC-PHI, Inc.) to calculate the atomic number ratio of C/Si by using peaks each corresponding to each binding energy of 2p of Si, 1s of O, 1s of N, and 1s of C obtained from the measured wide scan spectrums.

Examples of measures for controlling the atomic number ratio represented by the above formula (1) include a surface polishing method, surface etching method, and surface activation method, and, particularly, surface activation treatment for cleaning the surface of the thin film layer is preferable. Examples of the surface activation treatment include corona treatment, vacuum plasma treatment, atmospheric plasma treatment, $UV-O_3$ treatment, vacuum ultraviolet excimer lamp treatment, and flame treatment. In the case of using, for example, a UV-ozone cleaning apparatus (UV-312, manufactured by TECHNOVISION, INC.), it is preferable to perform treatment in the condition of an irradiation time of 60 seconds and an irradiation distance of 10 cm or less. Also, in the case of using an atmospheric plasma surface treatment apparatus (AP-T03-S440, manufactured by Sekisui Chemical Co., Ltd.), it is preferable to perform atmospheric plasma treatment on the surface of the thin film layer in the condition of a voltage of 100 to 150 V, a current of 1 to 10 A, and a process speed of 10 m/min or less.

Examples of measures for controlling the atomic number ratio represented by the above formula (1) include liquid washing treatment for washing the surface of the thin film layer. Examples of the liquid washing treatment include pure water washing treatment, ultra-pure water washing treatment, ultrasonic water washing treatment, scrub washing treatment, rinsing/washing treatment, and two-fluid rinsing treatment.

It is inferred that when the atomic number ratio of C/Si which is calculated from wide scan spectrums is in the range defined by the formula (1), relatively inert impurities or polymers containing a lot of carbons are removed and a plane containing a lot of silicons, oxygens, and carbons put in active state is exposed, with the result that when a separate layer is formed on the thin film layer, a chemical interaction is caused to improve interface strength, developing impact resistance.

When the surface of the thin film layer is subjected to a total reflection method (ATR method) in infrared spectrometry, the ratio of the intensity ($I_2$) of a peak at 1240 to 1290 $cm^{-1}$ to the intensity ($I_1$) of a peak at 950 to 1050 $cm^{-1}$ is in the range defined by the following formula (2):

$$0.01 \leq I_2/I_1 < 0.05 \quad (2)$$

The peak intensity ratio $I_2/I_1$ calculated from the results of the ATR method in infrared spectrometry is considered to represent the relative ratio of bonding Si—CH$_3$ to bonding Si—O—Si in the thin film layer. The above laminated film satisfying the formula (2) tends to be superior in gas barrier characteristics and impact resistance from the viewpoint of high denseness and reducing defects such as small gaps and cracks. With regard to the range of the peak intensity ratio $I_2/I_1$, the range shown by the formula: $0.01 \leq I_2/I_1 < 0.05$ is preferable and the range of $0.02 \leq I_2/I_1 < 0.04$ is more preferable from the viewpoint of keeping the laminated film in highly densified state.

Infrared spectrometry of the surface of the thin film layer of the laminated film may be performed by a known method, for example, a Fourier transformation type infrared spectrophotometer (FT/IR-460Plus), manufactured by JASCO Corporation with ATR attachment (PIKE MIRacle) using, for example, a germanium crystal as the prism.

When the surface of the thin film layer is subjected to the ATR method in infrared spectrometry, the ratio of the intensity ($I_3$) of a peak at 770 to 830 cm$^{-1}$ to the intensity ($I_1$) of a peak at 950 to 1050 cm$^{-1}$ is preferably in the range defined by the following formula (3):

$$0.25 \leq I_3/I_1 \leq 0.50 \qquad (3)$$

The peak intensity ratio $I_3/I_1$ calculated from the results of the ATR method in infrared spectrometry is considered to represent the relative ratio of bonding Si—C, Si—O, or the like to bonding Si—O—Si in the thin film layer. The above laminated film satisfying the formula (3) is considered to keep highly densified state and to be superior in bending resistance and impact resistance because carbon is introduced. With regard to the range of the peak intensity ratio $I_3/I_1$, the range of $0.25 \leq I_3/I_1 \leq 0.50$ is preferable and the range shown by the following formula: $0.30 \leq I_3/I_1 \leq 0.45$ is more preferable from the viewpoint of keeping the balance between the denseness and bending resistance of the laminated film.

When the surface of the thin film layer is subjected to the ATR method in infrared spectrometry, the ratio of the intensity ($I_4$) of a peak at 870 to 910 cm$^{-1}$ to the intensity ($I_3$) of a peak at 770 to 830 cm$^{-1}$ is preferably in the range defined by the following formula (4):

$$0.70 \leq I_4/I_3 < 1.00 \qquad (4)$$

The peak intensity ratio $I_4/I_3$ calculated based on the the ATR method in infrared spectrometry is considered to represent the ratio of a peak derived from Si—C in the thin film layer. The above laminated film satisfying the formula (4) is considered to be superior in bending resistance and impact resistance because carbon is introduced thereinto, while keeping high denseness. With regard to the range of the peak intensity ratio $I_4/I_3$, the range of $0.70 \leq I_4/I_3 < 1.00$ is preferable and the range of $0.80 \leq I_4/I_3 < 0.95$ is more preferable from the viewpoint of keeping the balance between the denseness and the bending resistance of the laminated film.

The thin film layer is preferably formed by a plasma chemical vapor deposition method (plasma CVD process) as will be described later.

The thin film layer is preferably formed using glow discharge plasma.

The thickness of the thin film layer is preferably 5 to 3000 nm from the viewpoint of being hard to be broken when the laminated film is bent. When a thin film layer is formed by a plasma CVD process using glow discharge plasma as will be mentioned later, the thickness of the thin film layer is more preferably 10 to 2000 nm and even more preferably 100 to 1000 nm because the thin film layer is formed while discharging through the substrate.

The thin film layer provided in the laminated film used in this embodiment preferably has an average density as high as 1.8 g/cm$^3$ or more. The "average density" of the thin film layer in this description can be determined by calculating the weight of the thin film layer in the measured range from the atomic numbers of silicon, carbon, and oxygen determined by Rutherford Backscattering Spectrometry (RBS) and from the atomic number of hydrogen determined by Hydrogen Forward scattering Spectrometry (HFS) and by dividing the weight by the volume (product of the area irradiated with ion beams and film thickness) of the thin film layer in the measured range.

The thin film layer has a density of 1.8 g/cm$^3$ or more, and therefore, the laminated film has a structure with high denseness and reduced in defects such as small gaps and cracks. When the thin film layer includes a silicon atom, oxygen atom, carbon atom, and hydrogen atom, the average density of the thin film layer is preferably less than 2.22 g/cm$^3$.

The laminated film of the present invention preferably has high transparency, and therefore, the total light transmittance of the laminated film is preferably 80% or more and more preferably 85% or more. The total transmittance can be measured by a direct reading phase computer (Model: HGM-2DP) manufactured by Suga Test Instruments Co., Ltd.

In this embodiment, a curve is referred to as a silicon distribution curve which shows a relationship between a distance from the surface of the thin film layer in the film thickness direction of the thin film layer and an atomic ratio of a silicon atom at each distance. Here, the surface of the thin film layer indicates a plane to be the surface of the laminated film. Similarly, a curve is referred to as an oxygen distribution curve which shows a relationship between the distance from the surface of the thin film layer in the film thickness direction of the thin film layer and an atomic ratio of an oxygen atom at each distance. Additionally, a curve is referred to as a carbon distribution curve which shows a relationship between the distance from the surface of the thin film layer in the film thickness direction of the thin film layer and an atomic ratio of a carbon atom at each distance. The atomic ratios of a silicon atom, oxygen atom, and carbon atom mean a ratio of the number of silicon atoms, a ratio of the number of oxygen atoms, and a ratio of the number of carbon atoms, respectively.

The silicon distribution curve, oxygen distribution curve, and carbon distribution curve of the thin film layer preferably satisfy all of the following requirements (i), (ii), and (iii).

(i) the atomic number ratio of silicon, the atomic number ratio of oxygen, and the atomic number ratio of carbon satisfy the requirement represented by the following formula (5) in 90% or more of the area of the thin film layer in the film thickness direction of the thin film layer:

(Atomic number ratio of oxygen)>(Atomic number ratio of silicon)>(Atomic number ratio of carbon) \qquad (5)

(ii) the carbon distribution curve has at least one extreme value; and (iii) an absolute value of a difference between the maximum value and the minimum value of the atomic number ratio of carbon in the carbon distribution curve is 0.05 or more.

It is preferable that the carbon distribution curve of the thin film layer be substantially continuous. The phrase the carbon distribution curve is substantially continuous means that the carbon distribution curve does not include a part where the atomic ratio of carbon discontinuously varies. Specifically, when a distance from the surface of the thin film layer in the film thickness direction is x [nm] and the atomic ratio of carbon is C, it is preferable to satisfy the following formula.

$$|dC/dx| \leq 0.01$$

Also, the carbon distribution curve of the thin film layer preferably has at least one extreme value. The extreme value stated here means the maximum value or the minimum value of the atomic ratio of each element to the distance from the surface of the thin film layer in the film thickness direction. The extreme value is a value of atomic ratio at a point where the atomic ratio of an element turns from increase to decrease or at a point where the atomic ratio of an element turns from decrease to increase when the distance from the surface of the thin film layer in the film thickness direction is changed. The extreme value can be determined, for example, based on atomic ratios measured at a plurality of measurement positions in the film thickness direction. The positions at which the atomic ratio is measured are so set that the interval in the film thickness direction is, for example, 20 nm or less. A position of an extreme value in the film thickness direction can be obtained by, for example, comparing measured results at three or more measurement positions different from one another based on a discrete data group including measured results at each measurement position and by determining a position where the measured result turns from increase to decrease or a position where the measured result turns from decrease to increase. A position of an extreme value can also be obtained by, for example, differentiating an approximate curve determined from the aforementioned discrete data group. When the length of a section where the atomic ratio is monotonically increased or decreased is, for example, 20 nm or more from the position of an extreme value, the absolute value of a difference between the extreme vale and the atomic ratio at a position moved by 20 nm in the film thickness direction from the position of an extreme value is, for example, 0.03 or more.

The thin film layer so formed as to satisfy the requirement that the carbon distribution curve has at least one extreme value as mentioned above is more reduced in an increase in the amount of gas transmittance before and after the thin film layer is bent as compared with the case where the above requirement is unsatisfied. In other words, when the above requirement is satisfied, an effect of suppressing deterioration in gas barrier characteristics caused by bending is obtained. When the thin film layer is so formed that the number of extreme values in the carbon distribution curve is two or more, an increase in the amount of gas transmittance is smaller than the case where the number of extreme values in the carbon distribution curve is one. Also, when the thin film layer is so formed that the number of extreme values in the carbon distribution curve is three or more, an increase in the amount of gas transmittance is smaller than the case where the number of extreme values in the carbon distribution curve is two. When the carbon distribution curve has two or more extreme values, an absolute value of a difference between the distance to a position of a first extreme value from the surface of the thin film layer in the film thickness direction and the distance to a position of a second extreme value neighboring to the first extreme value from the surface of the thin film layer in the film thickness direction is preferably in the range of 1 nm or more and 200 nm or less, and more preferably in the range of 1 nm or more and 100 nm or less.

Also, the absolute value of a difference between the maximum value and the minimum value of the atomic ratio of carbon in the carbon distribution curve of the thin film layer is preferably 0.05 or more. The thin film layer so formed as to satisfy the above requirement is more reduced in an increase in the amount of gas transmittance before and after the thin film layer is bent as compared with the case where the above requirement is unsatisfied. In other words, when the above requirement is satisfied, an effect of suppressing deterioration in gas barrier characteristics caused by bending is obtained. When the absolute value of a difference between the maximum value and the minimum value of the atomic ratio of carbon is 0.06 or more, the above effect is increased and when this absolute value is 0.07 or more, the above effect is more increased.

There is a tendency that the gas barrier characteristics of the thin film layer are more improved with a decrease in the absolute value of a difference between the maximum value and the minimum value of the atomic ratio of silicon in the silicon distribution curve. From this point of view, the above absolute value is preferably less than 0.05 (less than 5 at %), more preferably less than 0.04 (less than 4 at %), and particularly preferably less than 0.03 (less than 3 at %).

Also, when the sum of the atomic ratios of an oxygen atom and a carbon atom at each distance in the oxygen-carbon distribution curve is defined as "total atomic ratio", there is a tendency that the gas barrier characteristics of the thin film layer are improved with a decrease in the absolute value of a difference between the maximum value and the minimum value of the total atomic ratio. From this point of view, the total atomic ratio is preferably less than 0.05, more preferably less than 0.04, and particularly preferably less than 0.03.

When the thin film layer is made to have substantially uniform composition in the thin film layer surface direction, the gas barrier characteristics of the thin film layer can be made to be uniform and improved. The phrase substantially uniform composition means that, in the oxygen distribution curve, carbon distribution curve, and oxygen-carbon distribution curve, the numbers of extreme values existing in each of the film thickness directions at optional two points on the surface of the thin film layer are equal to each other, and the absolute values of differences between the maximum value and the minimum value of the atomic ratio of carbon in each carbon distribution curve are equal to each other or are different by 0.05 or less from each other.

The thin film layer so formed as to satisfy the above requirement can exhibit the gas barrier characteristics required for, for example, flexible electronic devices including, for example, organic EL elements.

[Method for Producing a Laminated Film]

The laminated film of the present invention can be produced by forming, on the flexible substrate, the thin film layer by a known vacuum film formation method such as a plasma CVD process using a glow discharge plasma. A generated plasma is a high-density and low-temperature plasma and is therefore preferable because it is suitable to the formation of a dense and thin film on such a flexible substrate having low heat resistance as those used in the present invention.

When the thin film layer is formed (film formation) by a plasma CVD process, it is preferable to form the thin film layer by a plasma CVD process in which a flexible substrate is disposed on a pair of film formation electrodes to discharge electricity between the pair of film formation electrodes, thereby generating plasma. The pair of film formation electrodes may have a form of parallel plates or rolls. When discharging electricity between a pair of film formation rolls in this manner, it is preferable to alternately invert the polarities of the pair of film formation rolls.

When a plasma is generated by a plasma CVD process, it is preferable to generate plasma discharge in a space between a plurality of filming rolls and it is more preferable to generate a plasma by using a pair of filming rolls, disposing a substrate on each of the pair of filming rolls and discharging across the pair of filming rolls. This process ensures that the surface part of the substrate existing on one filming roll is coated with a film and the surface part of the substrate existing on another filming roll is coated with a film at the same time during film formation. Therefore, not only the thin film layer can be efficiently formed but also the rate of film formation can be doubled. Also, it is preferable to form the thin film layer on the surface of the substrate by a roll-to-roll system from the viewpoint of productivity. The apparatus which can be used for producing the laminated film by the plasma CVD process is preferably, though not particularly limited to, one having a structure which is provided with at least one pair of filming rolls and a plasma power source and is capable of discharging in a space between the pair of filming rolls.

Examples of the film formation apparatus to be applied to the roll-to-roll system plasma CVD process include apparatuses provided with a feed roll, conveying roll, film formation roll, conveying roll, and winding roll in order from the film formation upstream side (upstream side in the substrate-conveying direction), and also provided with a gas supply tube, plasma generation power source, and magnetic field-generating apparatus. Among them, at least the film formation roll, gas supply tube, and magnetic field-generating apparatus are disposed in a vacuum chamber in the formation of the thin film layer, and this vacuum chamber is connected to a vacuum pump. The pressure inside of the vacuum chamber is controlled by the action of the vacuum pump.

The film formation apparatus is preferably provided with a pair of film formation rolls as the film formation roll and is preferably further provided with a conveying roll between these film formation rolls. Then, the film formation apparatus is also preferable which is further equipped with magnetic field generating apparatuses inside of these film formation rolls wherein these magnetic field generating apparatuses are so installed that they are not changed in posture with the rotation of the film formation rolls.

When such a film formation apparatus is used, the substrate wound by the feed roll is conveyed from the feed roll to the film formation roll in the former stage (upstream side) via the conveying roll disposed at the most upstream side. Then, the laminated film provided with the thin film layer formed on the surface of the substrate is conveyed to the film formation roll in the latter stage (downstream side) from the film formation roll in the former stage via the conveying roll. Then, the laminated film obtained by further film formation to form the thin film layer is conveyed to the winding roll from the film formation roll in the latter stage via the conveying roll disposed on farther downstream side (most downstream side) and is wound around the winding roll.

In the aforementioned film formation apparatus, the pair of film formation rolls (the former stage and the latter stage) is so disposed as to face each other. Then, the axes of these film formation rolls are substantially parallel to each other and have substantially equal diameters. In such a film formation apparatus, a film is formed when the substrate is conveyed on the former film formation roll and when the laminated film is conveyed on the latter film formation roll. As the film formation apparatus, an apparatus described in, for example, JP-A-2011-73430 or the like is used.

In the film formation apparatus, it is so designed as to be able to generate a plasma in a space sandwiched between the pair of filming rolls. The plasma generation power source is electrically connected with the electrodes in these filming rolls and these electrodes are disposed so as to sandwich the above space.

The film formation apparatus can generate a plasma by the power supplied to the electrodes from the plasma generation power source. As the plasma generation power source, known power sources or the like may be properly used. Examples of the power source include AC power sources capable of alternately inverting the polarities of the above two electrodes. The plasma generation power source is so designed that the power to be supplied is set to 0.1 to 10 kW and AC frequency is set to, for example, 50 Hz to 100 MHz from the viewpoint of a possibility of efficient film formation. AC frequency set to 1 MHz to 100 MHz may be used from the viewpoint of improving raw material gas decomposition efficiency.

The magnetic field-generating apparatus disposed inside of the film formation roll can generate a magnetic field in the aforementioned space and may generate a magnetic field so as to change the magnetic flux density in the direction of conveyance on the film formation roll.

The gas supply tube has the capability of supplying the supply gas used to form the thin film layer to the aforementioned space. The supply gas contains a raw material gas for the thin film layer. The raw material gas supplied from the gas supply tube is decomposed by the plasma generated in the space to thereby form the film component of the thin film layer. The film component of the thin film layer is deposited on the substrate or laminated film conveyed on the pair of film formation roll.

For example, an organic silicon compound containing silicon may be used as the raw material gas. Examples of the organic silicon compound include hexamethyldisiloxane, 1,1,3,3-tetramethyldisiloxane, vinyltrimethylsilane, methyltrimethylsilane, hexamethyldisilane, methylsilane, dimethylsilane, trimethylsilane, diethylsilane, propylsilane, phenylsilane, vinyltriethoxysilane, vinyltrimethoxysilane, tetramethoxysilane, tetraethoxysilane, phenyltrimethoxysilane, methyltriethoxysilane, and octamethylcyclotetrasiloxane. Among these organic silicon compounds, hexamethyldisiloxane and 1,1,3,3-tetramethyldisiloxane are preferable from the viewpoint of handleability of the compound and gas barrier characteristics of a thin film layer to be obtained. Also, these organic silicon compounds may be used either singly or in combinations of two or more types.

Also, besides the above organic silicon compound, monosilane may be contained as the raw material gas and this raw material gas may be used as the silicon source of the barrier film.

The supply gas may contain a reaction gas besides the raw material gas. As the reaction gas, a gas which reacts with the raw material gas to form inorganic compounds such as oxides and nitrides may be appropriately selected prior to use. Examples of the reaction gas for forming oxides include oxygen and ozone. Also, examples of the reaction gas for forming nitrides include nitrogen and ammonia. These reaction gases may be used either singly or in combinations of two or more types. When, for example, an oxynitride is formed, a combination of a reaction gas for forming oxides and a reaction gas for forming nitrides may be used.

The supply gas may contain at least one of a carrier gas and a discharge gas. As the carrier gas, a gas that promotes the supply of the raw material gas into the vacuum chamber may be appropriately selected prior to use. As the discharge gas, a gas that promotes the generation of plasma discharge in the space may be appropriately selected prior to use. Examples of the carrier gas and discharge gas include rare gases such as helium gas, argon gas, neon gas, and xenon gas; and hydrogen gas. These carrier and discharge gases may be used either singly or in combinations of two or more types.

The following explanations are furnished taking, as an example, a case of producing a silicon-oxygen type thin film layer. The supply gas in this example contains hexamethyldisiloxane (organic silicon compound: HMDSO: $(CH_3)_6Si_2O$) as the raw material gas and oxygen ($O_2$) as the reaction gas.

In the plasma CVD process, silicon dioxide is formed by the reaction shown by the following formula (A) when hexamethyldisiloxane and the supply gas containing oxygen are reacted.

$$(CH_3)_6Si_2O + 12O_2 \rightarrow 6CO_2 + 9H_2O + 2SiO_2 \quad (A)$$

The ratio of the amount of the reaction gas to the amount of the raw material gas in the supply gas is so set as not to be excessively higher than the ratio (stoichiometric ratio) stoichiometrically required to react the raw material gas completely. For example, in the reaction shown by the formula (A), the amount of oxygen stoichiometrically required to completely oxidize 1 mol of hexamethyldisiloxane is 12 mol. In other words, a uniform silicon dioxide film is formed as the thin film layer in theory when the supply gas contains 12 mol or more of oxygen based on 1 mol of hexamethyldisiloxane. However, there is, actually, the case where a part of the supply gas to be supplied does not contribute to the reaction. In light of this, a gas containing the reaction gas is usually supplied in a ratio higher than the stoichiometric ratio to completely react the raw material gas. Actually, the molar ratio (hereinafter referred to as "effective ratio") of the reaction gas for completely reacting with the raw material gas to the raw material gas can be found by experiments or the like. For example, there is the case where the molar amount (flow rate) of oxygen is made to be 20 times (as the effective ratio) the molar amount (flow rate) of raw material hexamethyldisiloxane to thereby completely oxidize hexamethyldisiloxane by the plasma CVD process. In light of this, the ratio of the amount of the reaction gas to the amount of the raw material gas in the supply gas may be less than the effective ratio (for example, 20), may be a stoichiometric ratio or less (for example, 12), or may be less than the stoichiometric ratio (for example, 10).

In this embodiment, if the condition of the reaction is set to be the condition where the reaction gas is deficient such that the raw material gas cannot be completely reacted, carbon atoms and hydrogen atoms in incompletely oxidized hexamethylsiloxane are incorporated into the thin film layer. For example, in the above film formation apparatus, the thin film layer can be formed so as to satisfy the prescribed requirement by appropriately controlling one or more parameters such as the kind of the raw material gas, the ratio of the molar amount of the reaction gas to the molar amount of the raw material gas in the supply gas, power to be supplied to the electrodes, pressure in the vacuum chamber, each diameter of the pair of film formation rolls, and substrate conveying speed. In this case, one or more of the above parameters may be changed with time or may be changed spacially in a film formation area within a period during which the substrate passes through the film formation area facing the above space.

The power supplied to the electrodes can be properly controlled according to, for example, the kind of the raw material gas and pressure in the vacuum chamber and can be set to, for example, 0.1 to 10 kW. When the power is 0.1 kW or more, this heightens the effect of suppressing the occurrence of particles. Also, when the power is 10 kW or less, this heightens the effect of suppressing a flexible substrate from being damaged and wrinkled by the heat generated from the electrodes.

The pressure (degree of vacuum) in the vacuum chamber is arranged at the inside of the discharge port and can be controlled corresponding to the kind of raw material gas and the like and may be set to, for example, 0.1 Pa to 50 Pa, preferably 0.2 Pa to 10 Pa, more preferably 0.3 Pa to 5 Pa, even more preferably 0.4 Pa to 2 Pa, and particularly preferably 0.5 Pa to 1.5 Pa. When the pressure is in this range, a colorless and transparent thin film layer may be obtained because damages to the substrate are limited and deterioration in the adhesion between the substrate and the thin film layer can also be limited.

The conveying speed (line speed) of the flexible substrate is preferably equal to the conveying speed of the substrate when the substrate is made to be in contact with the conveying roll although it may be properly controlled corresponding to, for example, the kind of raw material gas and pressure in the vacuum chamber.

The thin film layer is preferably formed by a continuous film formation process and is more preferably continuously formed on a long length substrate conveyed continuously.

The thin film layer can be further formed on the flexible substrate from above by inverting the feed roll and winding roll to convey the substrate in a reverse direction after it is formed while conveying the flexible substrate from the feed roll to the winding roll. This process can be appropriately changed according to desired targets of the number of laminations, film thickness, and conveying speed.

According to the present invention, as mentioned above, a gas barrier laminated film can be provided which is superior in impact resistance in the case of forming a heterolayer on the thin film layer. Also, the laminated film of the present invention tends to be superior in optical characteristics, gas barrier characteristics, and adhesion.

The laminated film in the present invention can be used in the fields of packages such as those used in foodstuffs, industrial products, and medical supplies which need gas barrier characteristics. Also, the laminated film of the present invention is preferably used for flexible substrates in liquid crystal display devices, solar batteries, and electronic devices such as organic EL.

When the laminated film of the present invention is used as a flexible substrate of an electronic device, a device may be formed directly on the laminated film, or the laminated film is laminated on a device after the device is formed on a separate substrate.

EXAMPLES

The present invention will be explained in more detail by way of examples. It is to be noted that the film thickness of the thin film layer of the laminated film, atomic number ratios in the surface of the thin film layer, infrared spectrometry of the surface of the thin film layer, optical characteristics of the laminated film, and adhesion and impact resistance of the interface between the laminated film and a heterolayer were evaluated in the following methods.

<Film Thickness of Thin Film Layer>

A thin film layer was formed on a flexible substrate and a step difference between a non-film forming part and a film forming part was measured by a SURFCORDER ET200 manufactured by Kosaka Laboratory Ltd. to find the film thickness (T) of the thin film layer.

<X-Ray Photoelectron Spectroscopic Measurement of Surface of Thin Film Layer>

The atomic number ratio of the surface of the thin film layer of the laminated film was subjected to X-ray photoelectron spectrometry (QuanteraSXM, manufactured by ULVAC PHI, Inc.). AlKα rays (1486.6 eV, X-ray spot: 100 μm) were used as the X-ray source and a neutralization electron gun (1 eV) and slow Ar ion gun (10V) were used for electrification correction in the measurement. In the analysis after measurement, the obtained spectrums were analyzed using MultiPak V6.1A (manufactured by ULVAC-PHI, Inc.) to calculate the surface atomic number ratio of C/Si by using peaks each corresponding to each binding energy of 2p of Si, 1s of O, 1s of N, and 1s of C obtained from the measured wide scan spectrums. As the surface atomic number ratio, an average of values measured five times was adopted.

<Infrared Spectrometry (ATR Method) of Surface of Thin Film Layer>

Infrared spectrometry of the surface of the thin film layer of the laminated film were performed by a following method, for example, a Fourier transformation type infrared spectrophotometer (FT/IR-460Plus), manufactured by JASCO Corporation with ATR attachment (PIKE MIRacle) including, for example, a germanium crystal as the prism. In this case, a cyclic cycloolefin film (Zeonor ZF16, manufactured by ZEON Corporation) was used as the flexible substrate and a thin film layer was formed on the substrate to obtain a laminated film for infrared spectrometry.

<Optical Characteristics of Laminated Film>

The total light transmittance of the laminated film was measured by a direct reading phase computer (Model: HGM-2DP) manufactured by Suga Test Instruments Co., Ltd. After background measurement was made in the condition free from a sample, the laminated film was set to a sample holder to perform measurement, thereby determining the total light transmittance.

<Gas Barrier Characteristics of Laminated Film>

The gas barrier characteristics of the laminated film were measured by a calcium corrosion method (method described in JP-A-2005-283561) under conditions of a temperature of 40° C. and a humidity of 90% RH to determine the moisture permeability of the laminated film.

<Adhesion of Laminated Film to a Heterolayer on the Thin Film Layer>

The adhesion of the laminated film to a heterolayer on the thin film layer was determined based on the following adhesive test.

An adhesive film was applied onto the thin film layer of the laminated film at a 25° C. circumstance to manufacture a laminated body, which was then cut into a rectangular form having a size of 25 mm×50 mm. The rectangular laminated body was stored under a circumstance of 60° C. and 90% RH for 100 hours and then, visually observed. When interfacial peeling was not observed between the thin film layer and the adhesive film, the laminated body was rated as "0", and when interfacial peeling was observed, the laminated film was rated as "NG".

The above adhesive film means an adhesive film which had a peeling strength of 5 N or more when a glass substrate used as the material to be coated was applied to the above adhesive film and then, a 180° C.-peeling strength test using a 25-mm-wide test piece was made under ambient temperature.

<Impact Resistance of Laminated Film and Heterolayer on the Thin Film Layer>

The impact resistance of the laminated film and a heterolayer on the thin film layer is determined based on the following impact resistance test.

An adhesive film was applied as a heterolayer onto the thin film layer of the laminated film at a 25° C. circumstance to manufacture a laminated body, which was then cut into a rectangular form having a size of 25 mm×50 mm. The rectangular laminated body was bent at an angle of 180° C. in such a manner that the adhesive film faced outward to plastically deform and/or to break it and then, the surface of the adhesive film after the film was bent was visually observed. When peeling did not propagate to a place apart by 1 mm or more in a vertical direction from the line-shaped bent crease, the laminated film was rated as "0", and when peeling propagated to a place apart by 1 mm or more from the line-shaped bent crease, the laminated film was rated as "NG".

Production Example 1

Using a biaxially oriented polyethylene naphthalate film (PQDA5, manufactured by Teijin DuPont Films Japan Limited, thickness: 100 μm, width: 700 mm) as a substrate, this film was mounted on a feed roll in a vacuum chamber. After the pressure in the vacuum chamber was dropped to $1 \times 10^{-3}$ Pa or less, a thin film layer was formed on the substrate with conveying the substrate at a fixed speed of 0.5 m/min. The biaxially oriented polyethylene naphthalate film used as the substrate had such an asymmetric structure that one surface thereof was treated for promoting adhesion and the thin film layer was formed on the other surface untreated for promoting adhesion. In plasma CVD apparatus used to form the thin film layer, a plasma was generated between the pair of electrodes and the substrate was conveyed so as to be in contact with the surfaces of the electrodes to form a thin film layer on the substrate. Also, in the pair of electrodes, a magnet was disposed in each electrode such that magnetic flux density was increased on both of the electrode and the substrate and a plasma was trapped at a high density on the electrodes and substrate when the plasma was generated.

In the formation of the thin film layer, 100 sccm (Standard Cubic Centimeter per Minute, 0° C., one atmosphere standard) of hexamethyldisiloxane gas and 900 sccm of oxygen gas were introduced into a space to be a film formation zone between the electrodes and AC power (1.6 kW and a frequency of 70 kHz) was supplied to the space between the electrodes to discharge, thereby generating a plasma. Then, exhaust volume was controlled such that pressure in the periphery of a exhaust port in the vacuum chamber was 1 Pa and then, a thin film layer was formed on the conveyed substrate by a plasma CVD process. This step was repeated four times. In this case, the thin film layer of the obtained laminated film 1 had a thickness of 700 nm. The laminated film 1 had a total light transmittance of 87% and a moisture permeability of $2 \times 10^{-5}$ g/m²/day.

In also the case of using a cyclic cycloolefin film (Zeonor ZF16, manufactured by ZEON Corporation, thickness: 100 μm, width: 700 mm) to perform infrared spectrometry of the thin film layer of the laminated film 1, a thin film layer was formed in the same operation to obtain a laminated film 1'. The thickness and structure of the thin film layer of the obtained laminated film 1' were the same as those of the laminated film 1. Infrared spectrometry of the obtained laminated film 1' was performed in the above condition.

From the obtained infrared absorption spectrums, the absorption intensity ratio ($I_2/I_1$) of a peak intensity ($I_2$) at 1240 to 1290 cm$^{-1}$ to a peak intensity at 950 to 1050 cm$^{-1}$ was found to be $I_2/I_1$=0.03. Also, the absorption intensity ratio ($I_3/I_1$) of a peak intensity ($I_3$) at 770 to 830 cm$^{-1}$ to a peak intensity at 950 to 1050 cm$^{-1}$ was found to be $I_3/I_1$=0.37. Also, the absorption intensity ratio ($I_4/I_3$) of a peak intensity ($I_4$) at 870 to 910 cm$^{-1}$ to a peak intensity ($I_3$) at 770 to 830 cm$^{-1}$ was found to be $I_4/I_3$=0.91. In this case, the infrared absorption spectrums were not changed even by performing UV-$O_3$ treatment or atmospheric plasma treatment which will be explained later, showing the above absorption intensity ratio.

In the obtained laminated film 1, in 90% or more of the area of the thin film layer in the direction of the film thickness of the thin film layer, the atomic number ratios of oxygen, silicon, and carbon were decreased in this order, the carbon distribution curve in the direction of the film thickness had 10 or more extreme values, and the absolute value of a difference between the maximum value and minimum value of the atomic number ratio of carbon was 0.15 or more.

Figure 1:
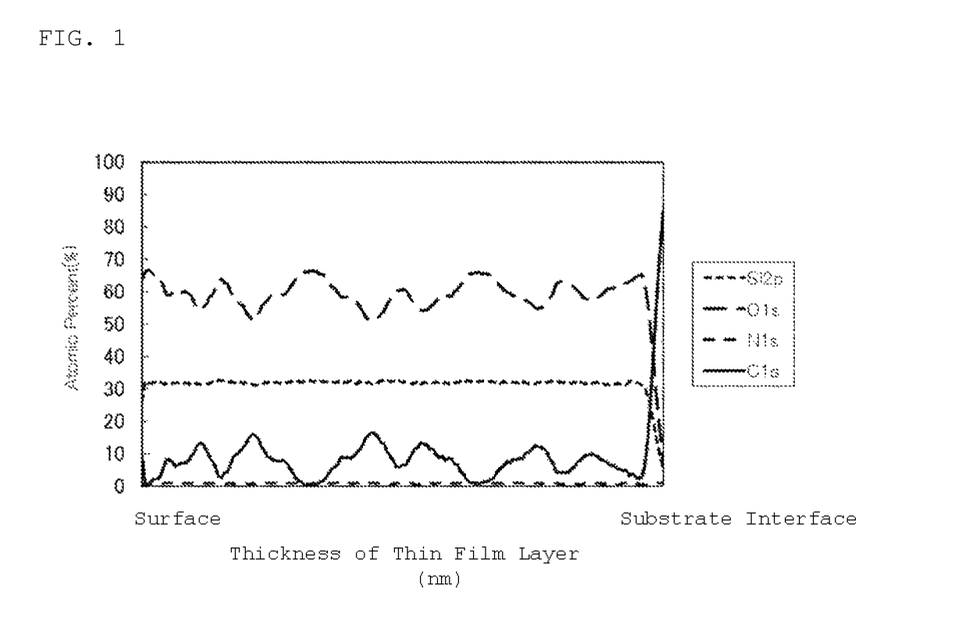
FIG. 1 is a graph illustrating a silicon distribution curve, oxygen distribution curve, nitrogen distribution curve, and carbon distribution curve of a thin film layer in a laminated film 1 obtained in Production Example 1.
Figure 2:
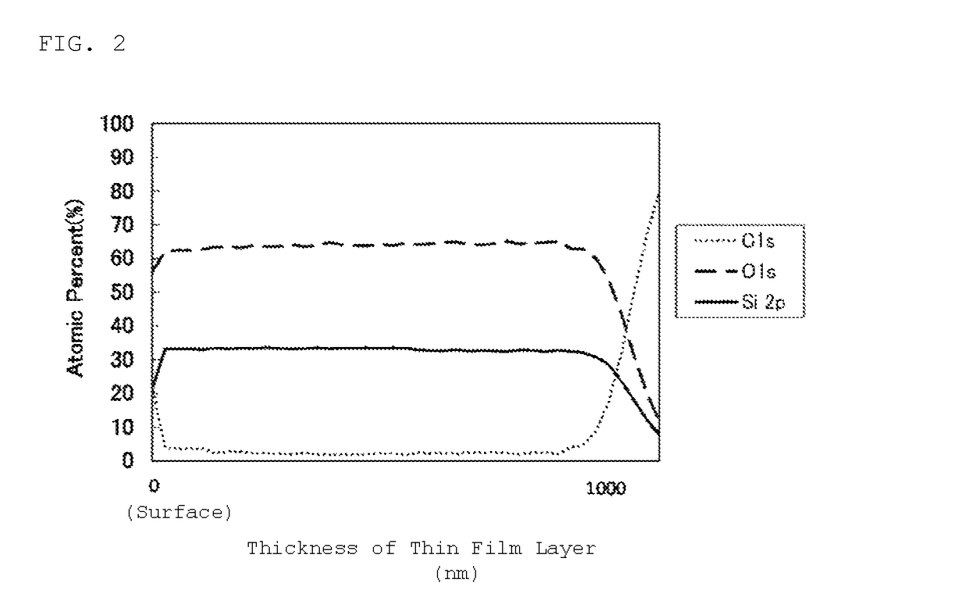
FIG. 2 is a graph illustrating a silicon distribution curve, oxygen distribution curve, nitrogen distribution curve, and carbon distribution curve of a thin film layer in a laminated film 6 obtained in Comparative Example 3.

Also, XPS depth profile measurement of the obtained laminated film 1 was made to find the distribution curves of silicon, nitrogen, oxygen, and carbon from the obtained results. In this case, the XPS depth profile was not changed even by performing UV-$O_3$ treatment and atmospheric plasma treatment which will be explained later, showing the same distribution curves obtained before these treatments.

<XPS Depth Profile Measurement>

Etching ion species: Argon (Ar$^+$)

Etching rate (conversion value in terms of SiO$_2$ thermal oxide film): 0.05 nm/sec Etching interval (conversion value in terms of SiO$_2$): 10 nm X-ray Photoelectron Spectroscopic apparatus: Model "VG Theta Probe", manufactured by Thermo Fisher Scientific, Inc.

Irradiation X-ray: single crystal spectral AlKα

X-ray spot and its size: 800×400 µm elliptical shape

Example 1

UV-$O_3$ treatment was performed on the surface of the thin film layer of the obtained laminated film 1 by using a UV-ozone cleaning apparatus (UV-312, manufactured by TECHNOVISION, INC.) for 600 seconds to obtain a laminated film 2. An optical clear adhesive 50 µm in thickness was applied to the surface of the thin film layer of the laminated film 2 under a circumstance of 25° C. by using a roll applicator to obtain a laminated body 1. The results of the impact resistance test of the laminated body 1 are shown in Table 1. Also, when an adhesive test of the laminated body 1 was made, no interfacial peeling was observed between the thin film layer and the adhesive film.

Example 2

UV-$O_3$ treatment was performed on the surface of the thin film layer of the laminated film 1 by using a UV-ozone cleaning apparatus (UV-312, manufactured by TECHNOVISION, INC.) for 1800 seconds to obtain a laminated film 3. An optical clear adhesive was applied to the surface of the thin film layer of the laminated film 3 in the same manner as in Example 1 to obtain a laminated body 2. The results of the impact resistance test of the laminated body 2 are shown in Table 1. Also, when an adhesive test of the laminated body 2 was made, no interfacial peeling was observed between the thin film layer and the adhesive film.

Example 3

Atmospheric plasma treatment was performed on the surface of the thin film layer of the laminated film 1 by using an atmospheric plasma surface treating apparatus (AP-T03-S440, manufactured by Sekisui Chemical Co., Ltd.) in the condition of a voltage of 130 V, a current of 4 A, and a treating speed of 20 mm/min to obtain a laminated film 4. An optical clear adhesive was applied to the surface of the thin film layer of the laminated film 4 in the same manner as in Example 1 to obtain a laminated body 3. The results of the impact resistance test of the laminated body 3 are shown in Table 1. Also, when an adhesive test of the laminated body 3 was made, no interfacial peeling was observed between the thin film layer and the adhesive film.

Example 4

A pressure sensitive adhesive (containing hygroscopic oxide) 20 µm in thickness was applied to the surface of the thin film layer of the laminated film 3 under a circumstance of 25° C. by using a roll applicator to obtain a laminated body 4. The results of the impact resistance test of the laminated body 4 are shown in Table 1. Also, when an adhesive test of the laminated body 4 was made, no interfacial peeling was observed between the thin film layer and the adhesive film.

Example 5

A pressure sensitive adhesive (epoxy thermocurable type containing hygroscopic oxide) 20 µm in thickness was applied to the surface of the thin film layer of the laminated film 3 under a circumstance of 25° C. by using a roll applicator to obtain a laminated body 5. The results of the impact resistance test of the laminated body 5 are shown in Table 1. Also, when an adhesive test of the laminated body 5 was made, no interfacial peeling was observed between the thin film layer and the adhesive film.

Comparative Example 1

UV-$O_3$ treatment was performed on the surface of the thin film layer of the laminated film 1 by using a UV-ozone cleaning apparatus (UV-312, manufactured by TECHNOVISION, INC.) for 10 seconds to obtain a laminated film 5. An optical clear adhesive was applied to the surface of the thin film layer of the laminated film 5 in the same manner as in Example 1 to obtain a laminated body 6. The results of the impact resistance test of the laminated body 6 are shown in Table 1. Also, when an adhesive test of the laminated body 6 was made, no interfacial peeling was observed between the thin film layer and the adhesive film.

Comparative Example 2

An optical clear adhesive was applied to the surface of the thin film layer of the laminated film 1 in the same manner as in Example 1 to obtain a laminated body 7. The results of the impact resistance test of the laminated body 7 are shown in Table 1. Also, when an adhesive test of the laminated body 7 was made, no interfacial peeling was observed between the thin film layer and the adhesive film.

Comparative Example 31

Using a biaxially oriented polyethylene naphthalate film (PQDA5, manufactured by Teijin DuPont Films Japan Limited, thickness: 100 µm, width: 300 mm) as a substrate, this film was fixed in a vacuum chamber. After the pressure in the vacuum chamber was dropped to $1×10^{-3}$ Pa or less, a thin film layer was formed on the substrate. The thin film layer was formed using an inductively coupled plasma CVD apparatus including a batch type glow discharge plasma. The biaxially oriented polyethylene naphthalate film used as the substrate had such an asymmetric structure that one surface thereof was treated for promoting adhesion and the thin film layer was formed on the other surface untreated for promoting adhesion. In the film formation, 30 sccm (Standard Cubic Centimeter per Minute, 0° C., one atmosphere standard) of hexamethyldisiloxane gas, 150 sccm of oxygen gas, and 100 sccm of argon gas were introduced into a film formation zone and power (0.9 kW and a frequency of 13.56 kHz) was supplied to an induction coil to discharge, thereby generating a plasma. Then, exhaust volume was controlled such that pressure in the vacuum chamber was 2.5 Pa and then, a thin film layer was formed on the conveyed substrate by an inductively coupled plasma CVD process to obtain a laminated film 6. In this case, the thin film layer of the obtained laminated film 6 had a thickness of 1000 nm, and the laminated film 6 had a total light transmittance of 90% and a moisture permeability of 1.3 g/m²/day.

An optical clear adhesive was applied to the surface of the thin film layer of the laminated film 6 in the same manner as in Example 1 to obtain a laminated body 8. The results of the impact resistance test of the laminated body 8 are shown in Table 1. Also, when an adhesive test of the laminated body 8 was made, no interfacial peeling was observed between the thin film layer and the adhesive film. From the obtained infrared absorption spectrums, the absorption intensity ratio $(I_2/I_1)$ of a peak intensity $(I_2)$ at 1240 to 1290 cm$^{-1}$ to a peak intensity $(I_1)$ at 950 to 1050 cm$^{-1}$ was found to be $I_2/I_1=0.10$. Also, the absorption intensity ratio $(I_3/I_1)$ of a peak intensity $(I_3)$ at 770 to 830 cm$^{-1}$ to a peak intensity $(I_1)$ at 950 to 1050 cm$^{-1}$ was found to be $I_3/I_1=0.35$. Also, the absorption intensity ratio $(I_4/I_3)$ of a peak intensity $(I_4)$ at 870 to 910 cm$^{-1}$ to a peak intensity $(I_3)$ at 770 to 830 cm$^{-1}$ was found to be $I_4/I_3=0.50$.

Example 6

A laminated film 7 was formed in the same manner as in Example 1 except that 100 ccm (Standard Cubic Centimeter per Minute, 0° C., atmospheric pressure standard) of hexamethyldisiloxane gas and 600 sccm of oxygen gas were introduced in the film formation of the thin film layer. In this case, the thin film layer of the obtained laminated film 7 had a thickness of 700 nm and the laminated film 7 had a total light transmittance of 88% and a moisture permeability of $3×10^{-5}$ g/m²/day.

Example 7

A laminated film 8 was formed in the same manner as in Example 1 except that 100 ccm (Standard Cubic Centimeter per Minute, 0° C., atmospheric pressure standard) of hexamethyldisiloxane gas and 800 sccm of oxygen gas were introduced in the film formation of the thin film layer. In this case, the thin film layer of the obtained laminated film 8 had a thickness of 700 nm and the laminated film 8 had a total light transmittance of 88% and a moisture permeability of $2×10^{-5}$ g/m/day.

Example 8

A laminated film 7 was formed in the same manner as in Example 1 except that 100 ccm (Standard Cubic Centimeter per Minute, 0° C., atmospheric pressure standard) of hexamethyldisiloxane gas and 2000 sccm of oxygen gas were introduced in the film formation of the thin film layer. In this case, the thin film layer of the obtained laminated film 9 had a thickness of 700 nm and the laminated film 9 had a total light transmittance of 89% and a moisture permeability of $3×10^{-5}$ g/m²/day.

UV-O$_3$ treatment was performed on the surface of the thin film layer of each of the obtained laminated films 7, 8, and 9 by using a UV-ozone cleaning apparatus (UV-312, manufactured by TECHNOVISION, INC.) for 600 seconds to obtain laminated films 7', 8', and 9'. An optical clear adhesive 50 µm in thickness was applied to the surface of the thin film layer of each of the laminated film 7', 8', and 9' under a circumstance of 25° C. by using a roll applicator to obtain laminated bodies 9, 10, and 11. The results of the impact resistance test of each of the laminated bodies 9, 10, and 11 are shown in Table 2. Also, when an adhesive test of each of the laminated bodies 9, 10, and 11 was made, no interfacial peeling was observed between the thin film layer and the adhesive film.

TABLE 1

| | Surface atomic number ratio of Thin film layer C/Si | Type of Heterolayer on the thin film layer | Impact resistance |
|---|---|---|---|
| Example 1 | 0.18 | OCA | ○ |
| Example 2 | 0.10 | OCA | ○ |
| Example 3 | 0.16 | OCA | ○ |
| Example 4 | 0.10 | PSA | ○ |
| Example 5 | 0.10 | Thermally cured | ○ |
| Comparative Example 1 | 0.27 | OCA | NG |
| Comparative Example 2 | 0.27 | OCA | NG |
| Comparative Example 3 | 1.03 | OCA | NG |

TABLE 2

| | Surface atomic number ratio of Thin film layer C/Si | Infrared absorption $I_2/I_1$ $I_3/I_1$ $I_4/I_3$ | Type of Heterolayer on the thin film layer | Impact resistance |
|---|---|---|---|---|
| Example 6 | 0.18 | 0.03 0.42 0.90 | OCA | ○ |
| Example 7 | 0.10 | 0.03 0.39 0.90 | OCA | ○ |
| Example 8 | 0.16 | 0.03 0.29 0.84 | OCA | ○ |

It was confirmed from the above results that the laminated film according to the present invention was superior in impact resistance. Also, the laminated film of the present invention had excellent optical characteristics and gas barrier characteristics and a tendency that good adhesion was obtained when a heterolayer was formed on the thin film layer was observed.

INDUSTRIAL APPLICABILITY

The present invention can be used for gas barrier films.

The invention claimed is:

1. A laminated film comprising a flexible substrate and a thin film layer formed on at least one surface of the substrate, wherein;
   the thin film layer contains a silicon atom (Si), an oxygen atom (O), and a carbon atom (C), and the ratio of the number of carbon atoms to the number of silicon atoms which is calculated using peaks each corresponding to each binding energy of 2p of Si, is of O, 1s of N, and 1s of C obtained from wide scan spectrums is in the range defined by the following formula (1) when the surface of the thin film layer is subjected to X-ray photoelectron spectrometry; and
   a intensity ratio of a peak intensity ($I_2$) at 1240 to 1290 cm$^{-1}$ to a peak intensity ($I_1$) at 950 to 1050 cm$^{-1}$ is in the range defined by the following formula (2) when the surface of the thin film layer is measured by an ATR method in infrared spectrometry:

$$0.01 < C/Si \leq 0.02 \tag{1}$$

$$0.01 \leq I_2/I_1 < 0.05 \tag{2}.$$

2. The laminated film according to claim 1, wherein the intensity ratio of a peak intensity ($I_3$) at 770 to 830 cm$^{-1}$ to a peak intensity ($I_1$) at 950 to 1050 cm$^{-1}$ is in the range defined by the following formula (3) when the surface of the thin film layer is measured by an ATR method in infrared spectrometry:

$$0.25 \leq I_3/I_1 \leq 0.50 \tag{3}.$$

3. The laminated film according to claim 1, wherein the intensity ratio of a peak intensity ($I_4$) at 870 to 910 cm$^{-1}$ to a peak intensity ($I_3$) at 770 to 830 cm$^{-1}$ is in the range defined by the following formula (4) when the surface of the thin film layer is measured by an ATR method in infrared spectrometry:

$$0.70 \leq I_4/I_3 < 1.00 \tag{4}.$$

4. The laminated film according to claim 1, the laminated film satisfying all of the following requirements (i) to (iii) in a silicon distribution curve, oxygen distribution curve, and carbon distribution curve indicating the relationship between the distance from the surface of the thin film layer in the direction of the film thickness of the thin film layer and the atomic number ratio of silicon, the atomic number ratio of oxygen, and the atomic number ratio of carbon to the total number of silicon atoms, oxygen atoms, and carbon atoms contained in the thin film layer;
   (i) the atomic number ratio of silicon, the atomic number ratio of oxygen, and the atomic number ratio of carbon satisfy the requirement represented by the following formula (5) in 90% or more of an area of the thin film layer in the film thickness direction of the thin film layer:

$$\text{Atomic number ratio of oxygen} > \text{Atomic number ratio of silicon} > \text{Atomic number ratio of carbon} \tag{5}$$

(ii) the carbon distribution curve has at least one extreme value; and
   (iii) an absolute value of a difference between a maximum value and a minimum value of the atomic number ratio of carbon in the carbon distribution curve is 0.05 or more.

5. The laminated film according to claim 4, wherein the absolute value of a difference between the maximum value and the minimum value of the atomic number ratio of silicon in the silicon distribution curve is less than 5 at %.

6. The laminated film according to claim 1, wherein the thin film layer is formed by a plasma CVD process.

7. The laminated film according to claim 1, wherein the thin film layer is formed by using a glow discharge plasma.

8. A flexible electron device comprising, as a substrate, the laminated film as claimed in claim 1.

* * * * *